United States Patent [19]

Nakamura et al.

[11] Patent Number: 4,923,100
[45] Date of Patent: May 8, 1990

[54] PROCESS FOR PRODUCING CLAD SHEETS

[75] Inventors: Yasuyuki Nakamura, Takatsuki; Akio Hashimoto, Kobe; Toshiaki Fujita, Hirakata; Makoto Kawakami, Suita, all of Japan

[73] Assignee: Sumitomo Special Metals Co., Ltd., Osaka, Japan

[21] Appl. No.: 271,503

[22] Filed: Nov. 15, 1988

Related U.S. Application Data

[62] Division of Ser. No. 873,350, Jun. 12, 1986, Pat. No. 4,826,736.

[30] Foreign Application Priority Data

| Jun. 14, 1985 | [JP] | Japan | 60-130191 |
| Oct. 16, 1985 | [JP] | Japan | 60-230666 |
| May 10, 1986 | [JP] | Japan | 61-107174 |
| May 10, 1986 | [JP] | Japan | 61-107175 |
| May 10, 1986 | [JP] | Japan | 61-107176 |
| May 15, 1986 | [JP] | Japan | 61-111534 |

[51] Int. Cl.$^5$ .......................................... B23K 20/04
[52] U.S. Cl. .................................. 228/117; 228/116; 228/56.3; 427/35
[58] Field of Search .............. 228/117, 116, 203, 158, 228/193, 235, 243; 427/53.1, 35

[56] References Cited

U.S. PATENT DOCUMENTS

| 3,390,564 | 7/1968 | Syre et al. | 227/243 X |
| 3,800,406 | 4/1974 | Hagan et al. | 228/158 |
| 4,107,408 | 2/1980 | Heile | 228/235 |
| 4,122,240 | 10/1978 | Banas et al. | 427/35 |
| 4,348,263 | 9/1982 | Draper et al. | 427/53.1 |
| 4,423,120 | 12/1983 | Paulus et al. | 228/203 X |
| 4,471,204 | 9/1984 | Takafaji et al. | 219/164 |
| 4,568,014 | 2/1986 | Madsen et al. | 228/116 |
| 4,732,312 | 3/1988 | Kennedy et al. | 228/193 |

OTHER PUBLICATIONS

Gnanamuthu, "Laser Surface Treatment" from *Optical Engineering* 19(5), 783–792; Sep.–Oct. 1980.

Primary Examiner—Kenneth J. Ramsey
Attorney, Agent, or Firm—Burns, Doane, Swecker & Mathis

[57] ABSTRACT

A clad sheet comprising a metal substrate and a metal cladding layer laminated on at least one surface of said substrate, wherein said cladding layer-laminated surface of said substrate includes a hardened layer portion formed by melting and rapid solidification through laser beam irradiation. In intermediate layer may be interposed between the substrate and the cladding layer through like hardened layer portion. Lamination is made by cold-cladding layer elements after irradiating any one of layer elements with laser beam to produce strong bonding through uniform microcrack formed in the hardened layer portion of several micrometer thick. The clad sheets are useful for making IC lead frames, for which the substrate is conductor metal and the cladding layer is solder applied to partial area of the substrate. The irradiation and cladding process is carried out continuously with a reduced draft.

36 Claims, 11 Drawing Sheets

PROCESS FOR PRODUCING CLAD SHEETS

This application is a divisional of application Ser. No. 873,350, filed June 12, 1986, now U.S. Pat. No. 4,826,736.

BACKGROUND OF THE INVENTION

The present invention relates to a clad sheet comprising a metal substrate and a metal cladding layer (between which a metal intermediate layer may be provided), and a process for producing such a sheet.

More specifically, this invention relates to a novel clad sheet in which a cladding material is cold-cladding over an entire surface, or locally on the required area of, a substrate comprising a single or laminated sheet of metal (or alloy) and, more particularly, to a clad sheet of high quality and improved integrity, which allows high-efficiency cold cladding by rolling of a continuous (or strip-like) cladding material.

The cladding materials for electronical parts now available include laminated, striped clad sheets comprising Fe-Ni substrate (40 to 55% Ni-Fe)-Al sheet (substrate-cladding layer; this arrangement shall hereinafter hold), Fe-Ni substrate (40 to 55% Ni-Fe)-Ag solder sheet, Fe-Ni substrate (40 to 55% Ni-Fe)-Ag sheet, Kovar (trade name) alloy sheet-Ag solder sheet and the like, or full-surface clad sheets comprising Fe-Ni substrate (40 to 55% Ni-Fe)-Al sheet, Kovar alloy sheet (25 to 50% Ni, 10 to 20% Ni-Fe)-Ag solder sheet and the like. (If not otherwise specified, "%" denotes by weight in this application.)

For instance, Al striped clad sheets are generally produced by the following process. A metal substrate strip (or ribbon) of a 42% Ni-Fe alloy is annealed in a reducing atmosphere to clean out its surface, following which buffing is applied on a surface portion of the substrate to be cold-clad for further cleaning. At least one Al stripe of a given pattern is superposed upon that substrate for cold-cladding by rolling. Thereupon, in an as-clad state or after at least one cold-rolling has been applied, the resulting product is subjected to diffusion annealing at a temperature of 600° C. or lower to complete bonding of the Al stripe to the metal substrate. Furthermore, to adjust the size and shape of the clad sheets, the thus obtained product is subjected to at least one cold-rolling and is then heat-treated to apply tension and increase elongation to the clad stripe(s) in order to remove internal stress remaining ununiformly in the widthwise direction of the substrate due to striped cladding or stress remaining in the edge portions thereof after stamping-out, e.g., to make lead frames.

With mechanical polishing such as wire buffing, however, there is a fear that polishing may be extended from the required surface area of the substrate to be predetermined to be clad to other surface areas, for instance, to the entire surface thereof, resulting in cracking of the polished surface, occurrence and deposition of scaly metal powders and residence of dust. This may lead to a problem that, in bonding of the cladding layer, metal powders, said dust or gases are caught up on its surface to be clad, which may cause surface blistering.

Referring also to the so-called striped clad sheet having one or plural stripes of cladding layer clad on its surface, in particular, cracking tends to produce fine metal powders during cold-cladding by rolling or the subsequent cold-rolling, which are in turn attributable to deposition of said fine metal powders to the clad sheet, leading to a problem of deteriorations in the surface quality of the clad sheet, etc. In addition, the conventional production process needs a number of steps and heat treatment which incur an increase in the production cost, and offers problems in connection with defects occurring on the cladding material during diffusion annealing, surface-quality deteriorations.

SUMMARY OF THE DISCLOSURE

A primary object of the present invention is to provide a clad sheet in which the interface(s) between the constitutional elements (a substrate, a cladding layer and, optionally, an intermediate layer) has been (are) substantially cleaned out.

Another object of the present invention is to provide a clad sheet in which the constitutional elements excel in integrity.

A further object of the present invention is to provide a high-quality clad sheet free of surface blistering, flaws or like defects.

A still further object of the present invention is to provide a clad sheet which enables to reduce the draft, required for efficient cladding, at rolling.

Another primary object of the present invention is to provide a process and an apparatus capable of producing the aforesaid clad sheets with high efficiency.

Other objects of the present invention will become apparent in the entire disclosure.

According to the first aspect of the present invention, there is provided a clad sheet comprising a metal substrate and a clad sheet comprising a metal substrate and a metal cladding layer laminated on at least one surface of said substrate, wherein said cladding layer-laminated surface of said substrate includes a hardened layer portion formed by melting and rapid solidification.

According to the second aspect of the present invention, there is provided a clad sheet comprising a metal substrate and a metal intermediate layer and a metal cladding layer laminated on at least one surface of said substrate in that order, wherein said intermediate layer-laminated surface of said substrate and the cladding layer-laminated surface of said intermediate layer includes a hardened layer portion formed by melting and rapid solidification.

According to the third aspect of the present invention, there is provided a clad sheet comprising a metal substrate, a metal intermediate layer and a metal cladding layer laminated on one surface of said substrate in that order, and a metal cladding layer laminated on the other surface of said substrate, wherein both the surfaces of said substrate and said cladding layer-laminated surface of said intermediate layer each includes a hardened layer portion formed by melting and rapid solidification.

In the clad sheets according to the 1st, 2nd and 3rd aspects, the interface defined between the layer elements of the clad sheets, including the hardened layer portion formed by melting and rapid solidification, has been cleaned out, and the first-mentioned primary object and other objects are thus achieved.

According to the fourth aspect of the present invention, there is provided a process for producing clad sheets, which comprises irradiating at least one surface of a metal substrate with at least one laser beam, and cold-cladding a metal cladding layer material by rolling onto the beam-irradiated surface of said substrate.

According to the fifth aspect of the present invention, there is provided a process for producing clad sheets, which comprises the steps:

(a) irradiating at least one surface of a metal substrate with at least one laser beam, (b) cold-cladding a metal intermediate layer material by rolling onto the beam-irradiated surface of said substrate, (c) irradiating a free surface of said intermediate layer opposite to said substrate with at least one laser beam, and (d) cold-cladding a cladding layer material by rolling onto the beam-irradiated surface of said intermediate layer.

According to the sixth aspect of the present invention, there is provided a process for producing clad sheets, which comprises the steps:

(a) irradiating one surface of a metal substrate with at least one laser beam, (b) cold-cladding a metal intermediate layer material by rolling onto the beam-irradiated surface of said substrate, (c) irradiating a free surface of said intermediate layer opposite to said substrate with at least one laser beam, (d) cold-cladding a cladding layer material by rolling onto the beam-irradiated surface of said intermediate layer, (e) irradiating the other surface of said metal substrate with at least one laser beam, and (f) cold-cladding a metal cladding layer material onto the beam-irradiated surface of said substrate.

With the processes according to the 4th, 5th and 6th aspects of the present invention, it is possible to substantially reduce the number of steps and simplify and rapidly carry out each step, and thus to attain the aforesaid another primary object of the present invention.

In other words, according to the 4th, 5th and 6th aspects of the present invention, dust, fats and oils, and water deposited on the surface of the substrate absorb laser beam(s), and are thereby gasified and removed, so that the substrate is cleaned on the surface (including not only the irradiated area but also the surrounding unirradiated area which has been thermally affected).

According to a seventh aspect of the present invention there is provided an apparatus for producing a metal clad sheet comprising:

(a) means for continuously cold-cladding at least one metal cladding layer element onto a metal substrate layer element to form a clad sheet, (b) at least one means for irradiating a surface area to be clad of any one of said layer elements with laser beam, the irradiating means being disposed upstream of the cladding means and having a power to produce a hardened layer portion through melting an solidification by the irradiation.

Cleanness of the surface of the substrate causes interatomic bonding to occur easily between the substrate material and the applied layer material, and allows the substrate per se to absorb laser beam(s). In consequence, an extremely small surface depth of the order of less than several micrometers is molten and instantly solidified to form a hardened portion, which undergoes fine cracking due to internal slip deformation occurring during the cold-cladding by rolling of the cladding layer material, so that an internal fresh surface of the substrate metal is exposed, and any of the substrate metal and the cladding layer material is forced into the formed cracks to contact with the other due to rolling cladding force. Thus, it is possible to considerably improve the integrity (bonding force) of the substrate material with respect to the cladding layer material.

That is to say, in the prior art mechanical polishing, bonding is mechanically made between the substrate material and the cladding material during lamination due to the fact that not a little amount of dust is present on the surface of the substrate. In the present invention, however, the foregoing interatomic bonding due to the cleanness of the surface takes part in the entire strength, in addition to mechanical bonding. Furthermore, since the hardened layer portion according to the present invention is only formed on the extremely outermost layer of the application surface (ordinarily on the order of a thickness of 5 micrometers or less), microcracks occur thereon in the uniform and fine form, so that the resulting mechanical bonding force is stronger than the conventional one.

In addition, the process of the present invention can prevent surface cracking as well as occurrence and deposition of metal powders and residual dust, which would otherwise take place in association with the conventional mechanical polishing, and avoid surface blistering of the cladding layer, which would otherwise take place due to gas entrainment. In this connection, it is noted that complete cladding by rolling dispenses with the diffusion annealing treatment which was a requirement for obtaining stabilized bonding in the prior art. Furthermore, since a soft clad sheet can be obtained due to a reduction in the draft required for rolling, it is possible to prevent deformation after stamping-out; this making a contribution to energy savings.

While a draft of at least 70% is needed in the prior art, sufficient bonding force is obtained in the present invention, if a draft of 25 to 70% is applied.

According to the inventive process, the substrate metal (sheet) is laser-irradiated while moving, which provides easy irradiation of the strip like or staggered pattern by scanning.

The process of the present invention offers also an advantage over the conventional process that a longitudinally discontinous arrangement of island-like clads is more easily produced by longitudinally discontinuous irradiation of the substrate with laser beam(s). This is because laser beam(s) can easily be shielded.

In each aspect, the integrity of the metal substrate with the cladding layer material is further improved by interposing an intermediate layer therebetween and forming on said intermediate layer a hardened area similar to that formed on the metal substrate.

It is to be understood that the application of a cladding layer on one or both sides of the substrate or the provision of an intermediate layer may optionally be selected depending upon the purpose.

BRIEF DESCRIPTION OF THE DRAWINGS

FIGS. 7 to 10A and 10B are perspective views illustrating another embodiment of the process according to the present invention, FIG. 7 illustrating the roll-cladding of an intermediate layer with a cladding layer material, FIG. 8 illustrating a process according to the present invention including a step of providing a groove, FIG. 9 illustrating a process according to the present invention including a step of preheating, and FIG. 10 illustrating the lamination of a multiplicity of stripes.

DESCRIPTION OF THE PREFERRED EMBODIMENTS

Figure 1A:
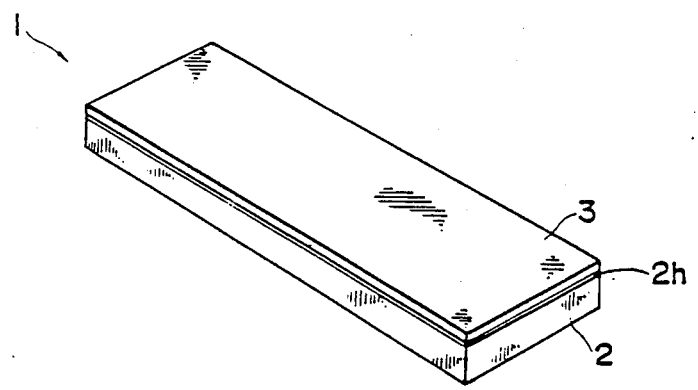
FIGS. 1A and 1B are perspective views showing one embodiment of the clad sheets according to the present invention.

Explanation will now be made to the preferred embodiments of the 1st, 2nd and 3rd aspects of the present invention.

The hardened surface area hardened by melting and rapid solidification area with its layer thickness portion (referred to as "hardened layer portion") should be produced by irradiation with laser beam(s). This enables the laser beam to remove dust deposited on the surface by evaporation, whereby that irradiated surface (thus resultant interface) is cleaned.

The hardened layer portion has a thickness of 5 micronmeters or lower. In such a thickness, microcracks occur easily on the hardened layer portion upon it receiving an external stress. Intermediate and cladding layers are laminated on the substrate, while in contact with the hardened layer portion, in a state where fresh portions neighboring the hardened layer portion penetrate into the microcracks, so that the bonding strength between the substrate layer and the cladding layer (or additionally with the intermediate layer) (all the layers being hereinafter referred to generally as the layer elements) is improved. The hardened layer portion should preferably be 5 micrometers or less, more preferably 2 micrometers or less, and most preferably 1 micrometer or less in thickness in order to form uniform microcrack upon cladding.

Turning to the relationship between the sheeting elements, whether the cladding layer is laminated on one or both surfaces of the substrate with or without the intermediate layer may optionally be selected according to the purpose.

The cladding layer may be laminated on the entire surface or a local surface area of one or both surface(s) of the substrate. Where the cladding layer is to be laminated on a local surface area of the substrate, it may be applied in the form of at least one stripe extending in the longitudinal direction of the substrate.

It may not be required that a region of the substrate laminated thereon with the cladding layer (called the clad surface) be in coincidence with a region of the substrate formed thereon with the hardened layer portion (called the hardened surface). In other words, the hardened surface can produce its own effect, even where it only corresponds to a part of the clad surface provided that the thermally affected area substantially covers the clad surface. Where the intermediate layer is provided, a similar relationship is found between the hardened surface and intermediate layer surface, or between the hardened intermediate surface and the clad surface.

The substrate used may be a single-layer sheet or a double or multiple-layer laminated sheet, which may be selected in view of improvements in conductivity, anti-corrosion property, strength and the like. Where the cladding layers are applied on both surfaces of the substrate, the requirements for the materials forming both cladding layers may be identical or different. One or more intermediate layers may also be used depending upon the purpose, for instance, brazing, etc.

In the present invention, it is required that, of the layer elements, at least the substrate includes a hardened layer portion. Where a plurality of interfaces are formed by the layer elements, a hardened layer portion may be allowed to be present on each interface. In this case, hardened layer portions may be permitted to be present on the interface not only between different layer elements (for instance, between the substrate and the cladding layer) but also between identical layer elements (for instance, between the same substrates per se, or between the same intermediate layers per se).

The present invention is also applicable to a composite clad sheet comprising a laminated combination of a plurality of said clad sheets.

It is understood that the outermost surface of the laminated side of the clad sheet may be either flattened or stepped (or grooved).

Use may be made of any types and combinations of the materials forming the layer elements, with which cladding can be achieved. The following are preferably used:

(a) Substrate Materials

Fe-Ni substrate materials (40 to 55% Ni-Fe),

Kovar (trade name) alloys (25 to 50% Ni- 10 to 20% Co-Fe), and

Copper alloys containing at least 55% Cu and at least one component no more than the amounts hereinbelow defined by weight %:

1.1% Be, 0.6% Mg, 1.0% Ti,
0.7% Zr, 1.6% Cr, 7.0% Mn,
6.0% Fe, 2.0% Co, 15% Ni,
0.5% B, 12% Al, 6.0% Si,
12% Sn, 0.08% Pb, 0.5% P,
0.6% Te, 1.5% Ag, 43% Zn, and
1.3% Cd.

(b) Intermediate Layer Materials

Cu, Cu alloys and Ni. (Cu alloys may be selected from those mentioned for the substrate material.)

(c) Cladding Layer Materials

Al, Al alloys, Ag, Ag solders, Au, and brass solders.

Where the cladding layer material is Ag or Ag solder, satisfactory results are obtained, if the intermediate layer is provided. A preferable material for the intermediate layer to this end is Cu, Cu alloys or Ni. As previously mentioned, the cladding layer may be formed on the entire, or a partial, surface area of one surface of the substrate. In the case of a full-surface clad sheet, its thickness is preferably 0.05 to 5.0 mm while, in the case of a striped clad sheet, its thickness is preferably 0.05 to 1.0 mm. Such thickness may optionally be selected depending upon the purpose.

Figure 1B:
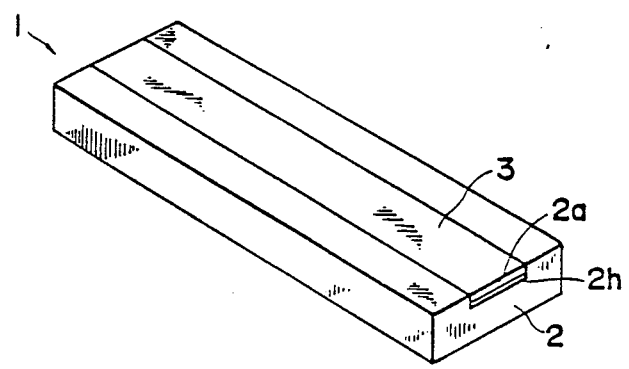
Figure 2A:
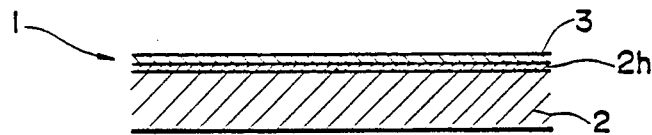
FIGS. 2A–C are sectioned views illustrating another embodiment of the clad sheets according to the present invention.

In the following, a preferred embodiment of the inventive clad sheets will be described with reference to FIGS. 1–4. As illustrated in FIGS. 1A and 2A, the clad sheet 1 according to the present invention may be of the structure that comprises a substrate 2 consisting of an Fe-Ni base sealing material (40 to 55% Ni-Fe) and a cladding layer 3 such as an Al sheet continuously clad over the entire surface thereof by cold-cladding through a hardened portion 2h formed by irradiating a substrate with laser beam to melt and solidify it. Alternatively, as illustrated in FIG. 1B, the invented clad sheet may be of the so-called striped structure that comprises a substrate 2 and a cladding layer 3 continuously clad on the required portion, e.g., the middle portion thereof by cold-cladding by rolling through a hardened portion 2h formed by irradiating a substrate with laser beam to melt and solidify it. It is to be noted that the provision of the striped cladding layer 3 may be achieved by forming at least one groove 2a (see also FIG. 8) of a width corresponding to that of the layer 3 on the substrate 2 and cladding the layer 3 into the groove 2a through the hardened portion 2h.

Figure 2B:
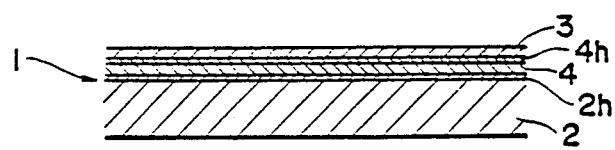

In the art, there are known clad sheets in which an intermediate layer is provided depending upon the combination of the cladding layer 3 and the substrate 2, each being formed of the required material. As illustrated in FIG. 2B, the clad sheet according to the present invention is of the structure in which an intermediate layer 4 of, e.g., Ni is continuously clad on the required main surface of a substrate 2 consisting of, e.g., an Fe-Ni alloy (40 to 55% Ni-Fe) through a hardened portion 2h of the substrate formed by laser beam irradiation, and a cladding layer 3 such as a Ag solder material is continuously clad onto the surface of the intermediate layer 4 through a hardened portion 4h of the intermediate layer formed by laser beam irradiation.

The clad sheet, in which the substrate 2 comprises a single sheet, and includes a cladding layer on one surface, has been explained with reference to FIGS. 2A and B. It is noted that the same explanation will hold for clad sheets including identical or different cladding layers on both surfaces of said substrate 2 as shown in FIG. 2C.

Figure 2C:
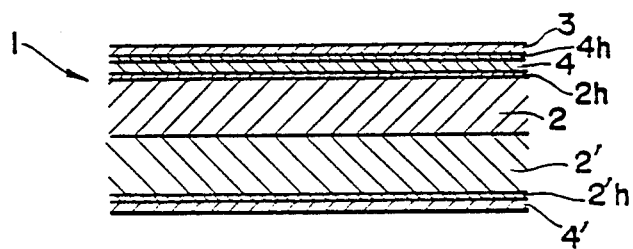

FIG. 2C illustrates a clad sheet including a double-layered substrate which consists of, e.g., a substrate element 2 formed of an Fe-Ni substrate material and a substrate element 2' formed of a Cu alloy. An intermediate layer 4 of Ni is continuously clad on the substrate element 2 through a hardened layer portion 2h of the substrate element 2 formed by laser beam irradiation, and a cladding layer 3 of a Ag solder material is continuously clad onto the surface of the intermediate layer 4 through a hardened layer portion 4h of the intermediate layer formed by laser beam irradiation. On the other hand, a cladding layer 4' of an Ag solder is clad on the substrate element 2' through a laser-irradiated hardened layer portion 2h in a continuous stripe.

It is to be noted that a hardened layer portion formed by laser beam irradiation may also be interposed between the substrate elements 2 and 2'.

Figure 3:
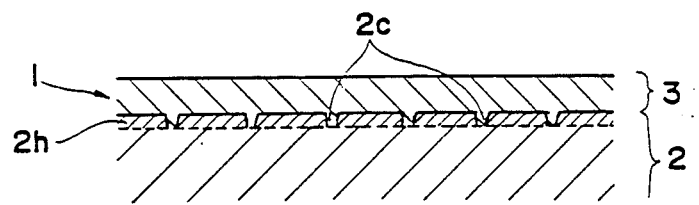
FIG. 3 is an enlarged sectional view showing part of one embodiment of the clad sheets according to the present invention.

Referring to the hardened layer portion, it is present on the bonding interface, i.e., the interface between the substrate 2 and the cladding layer 3, in the embodiment illustrated in FIG. 3. The hardened layer portion includes a uniform and fine distribution of a multiplicity of microcracks 2c . . . on the side facing the cladding layer 3, into which any one or both of the materials of the substrate 2 and cladding layer 3 is penetrated to be embedded, thus contributing to an increase in the bonding strength of the layer elements 2 and 3.

Figure 4:
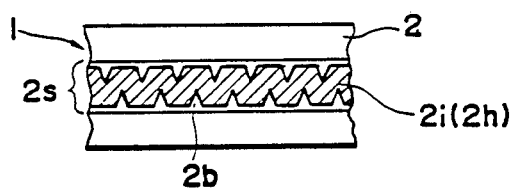
FIGS. 4 is a (partial) plan view showing one embodiment of the clad sheets according to the present invention.

As illustrated in FIG. 4, for instance, such a hardened layer portion 2h is staggeringly formed by beam irradiation in a plane. Even in this case, however, the surrounding portion 2i is also thermally affected, so that a striped cladding layer is contained in a striped region 2s including 2i.

Reference will now be made to the 4th, 5th and 6th aspects of the present invention.

The steps (a) to (f) as already mentioned may be carried out in varied orders, as long as the requirement that after laser beam irradiation, the irradiated portion is subjected to cold cladding under pressure (e.g., by rolling) is satisfied. Referring concretely to the irradiation steps (a) and (e) in the 6th aspect, any of these steps may be applied first. Alternatively, the two steps may simultaneously be carried out. Referring on the other hand to the cladding steps, i.e., the cladding steps (b) and (d) in the 5th aspect and the cladding steps (b), (d) and (f) in the 6th aspect, these cladding steps may be carried out separately or simultaneously of two or three.

Figure 5A:
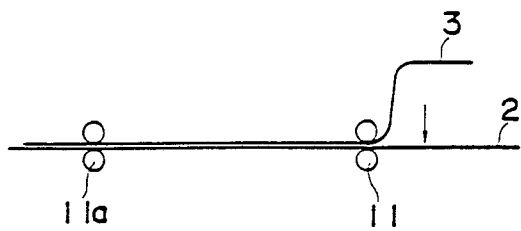
FIGS. 5A-F are simplified views illustrating the step procedures of the process according to the present invention.
Figure 5B:
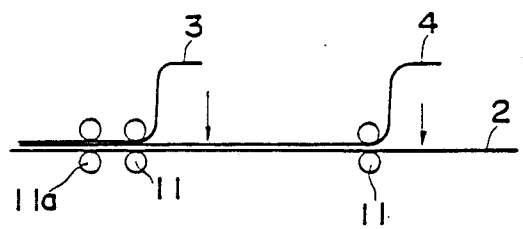
Figure 5C:
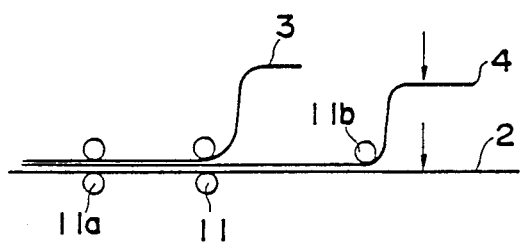

This is illustrated in FIGS. 5A–F in a simplified manner. FIGS. 5B–C show an arrangement in which the materials for cladding and intermediate layers 3 and 4 are roll-clad onto one side of a substrate, and FIGS. 5D and F illustrate an arrangement in which a cladding layer 3, etc. are clad onto both sides of a substrate 2. Throughout FIGS. 5A–F, arrow marks indicate the positions for irradiation.

(1-1) FIG. 5A illustrates a basic procedure, according to which a substrate 2 is first irradiated with beam, and is then clad by rolling (at 11) with a material for cladding layer 3. Thereafter, the resulting product may be fed into a nip between pressure rolls 11a for fine adjustment of draft.

(1-2) FIGS. 5B and C show the roll-cladding of the materials for cladding and intermediate layers 3 and 4. For the lamination of the intermediate layer 4, irradiation and roll cladding are first carried out and, for the lamination of the cladding layer 3, irradiation and rolling are thereafter carried out, as illustrated in FIG. 5B. Alternatively, as shown in FIG. 5C, the substrate 2 and the intermediate layer 4 may be irradiated with beam (in that order or the reverse order), and cladding (at 11) may then be applied simultaneously to the materials for a substrate 2, a cladding layer 3 and an intermediate layer 4. A guide roll 11b may be used.

Figure 5D:
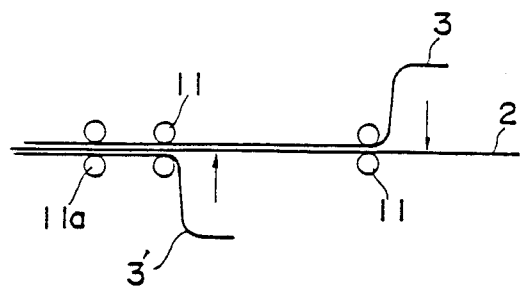
Figure 5E:
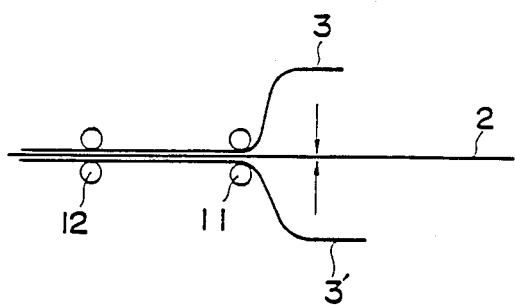

(2-1) FIGS. 5D and E show the lamination of cladding layers 3 on both sides of a substrate 2. As shown in FIG. 5D, the substrate 2 is first irradiated and roll-clad onto the first or front surface with beams and the cladding layer 3 for lamination, and is then irradiated and roll-clad onto the second (or reverse) surface with the cladding layer 3' for lamination. Alternatively, as shown in FIG. 5E, the substrate 2 may be irradiated with beam on the front and then back sides thereof and vice versa. Thereafter, the materials for cladding layers 3 and 3' may be roll-clad onto the irradiated surfaces of the substrate.

Figure 5F:
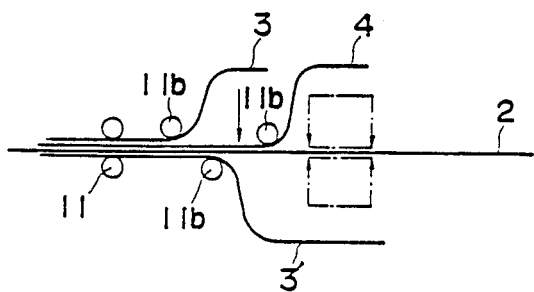

(2-2) FIG. 5F illustrates the lamination of intermediate and cladding layers 4 and 3 on the top side of a substrate 2 and a cladding layer 3' on the reverse side thereof. After carrying out irradiation in a suitable order, the materials for layers 3, 4 and 3' may simultaneously be roll-clad.

Furthermore, the irradiation and cladding steps for one interface may be followed by recoiling and then the irradiation and cladding steps for another interface may be conducted. Of course, as a further development, it may also be possible to apply a combination of the irradiation and cladding steps according to the present invention with a simple cladding step (without any pretreatment for the irradiation step) according to the prior art so long as such is acceptable.

In the beam irradiation steps, the laser beam is applied to the layer element surfaces between which the interface is to be formed, when the layer elements are laminated on each other. However, it may not be required to irradiate all the interfaces with laser beams; thus the laser beams may be applied to at least the substrate if such is aceptable. The cladding layer and intermediate layer may be of a single layer structure.

Of the layer elements forming the interfaces by lamination, laser beams may be applied to not only the element on which other element is to be laminated (the substrate or intermediate layer) but also to the laminating element (the intermediate or cladding layer), if required.

Referring to the area to be irradiated with laser beams, an area including a portion which is thermally affected may correspond to at least a surface area to be predetermined to be clad. This is because the surrounding unirradiated portion is also thermally affected during irradiation, whereby dust deposited on the surface thereof are gasified and cleaned out. In consequence, the area to be directly irradiated, i.e., the area to define the hardened layer portion may be a part of the surface to be predetermined to be clad. However, to make the region including the thermally affected portion in coincidence with the surface to be predetermined to be clad, it is preferred that the region for forming thereon the hardened layer portion is a main part, viz., about 70% or higher of the surface area to be predetermined to be clad.

To apply the laser beam uniformly on the surface of the sheeting element to be predetermined to be clad, spotted beam is allowed to scan linearly or two-dimensionally thereon through a mirror, or laser beams are alternatively increased in diameter by means of a lens system for a large spot irradiation of such a surface. Laser beam may also be applied partly on the surface of the sheeting element to be predetermined to be clad in a staggered, meandered or striped manner. The staggered scanning may be achieved by linearing oscillating the beam spot while the substrate is moving transverse to the beam oscillating direction. Such irradiation permits the thermally affected surface area to substantially cover the area to be clad.

If the diameter of beams is incresed with the use of a lens, etc., then it is possible to increase the scanning rate of, and the spacing between beam spots and hence the efficiency of processing.

No particular limitation is imposed upon the beam irradiation conditions, as long as the energy of beams is only absorbed on the outermost surface layer of, e.g., 5 microns or less in thickness without producing any adverse influence upon the interior of the substrate, etc., thereby gasifying deposited dust and melt the substrate surface, etc. This will be explained in terms of the power density and wavelength of the beam.

So long as said materials are concerned, the power density of the beam is in a range of, preferably 100 to 1500 kW/mm$^2$ and more preferably 300 to 900 kW/mm$^2$. Laser beams having a power density of below 100 kW/mm$^2$ produces not sufficient surface-cleaning effect for cladding, while laser beams having a power density exceeding 1500 kW/mm$^2$ results in large surface irregularities. Stillmore, with such an increase in the power density, undesired pores tend to be formed.

Turning to the wavelength of laser, an effective wavelength is 2 micrometers or less. Use of a wavelength of 2 micrometers or less is desired, since a wavelength exceeding 2 micrometers has a limited absorption effect upon the substrate.

For irradiation, the laser beams may be oscillated from a laser oscillator, condensed through a collimator and a lens system, and guided to a given position through an optic system.

Oscillation of laser beams may be achieved by using a scanning means like a galvanic mirror or rotating a polyhedral mirror. For local irradiation, the laser beam may preferably be condensed to a certain width with a cylindrical lens, or be guided by way of an optical fiber. The irradiation conditions should be determined in accordance with various factors such as the materials or sizes of the layer elements (substrate, cladding and intermediate layers), the conditions including generating manner of laser beam, output, focusing and focus distance to the irradiated surface, moving speed of the irradiation object and the like.

The conditions for the cold cladding step may be expressed in terms of a draft of 25 to 70%. Under such conditions, it is possible to produce microcracks on the hardened layer portion formed by beam irradiation during the cladding.

The draft is then in a range of, preferably 30–50% and, more preferably, 25–40%.

A groove-forming step may be carried out before the irradiation step (and may be after the irradiation step for another interface). In other words, where the cladding layer and, optionally, the intermediate layer are laminated on one surface of the substrate in a local manner (for instance, in the form of a single stripe or multiple stripes), the substrate is formed with a groove at the position for lamination, and that groove is then irradiated with laser beams, whereby the resulting clad sheet products are improved in respect of the shape and dimensional precision, and are made suitable for use in lead frames for which high precision is required. In this case, after the formation of the groove and before the irradiation of laser beam, the grooved material may be annealed at 850°–1050° C. to remove internal residual stress due to the grooving. Such an effect is also obtained by applying laser beams upon the position, corresponding to the groove, of the surface of the substrate in opposition to the surface on which the groove is formed. It is noted that the depth of the groove may correspond to the thickness of, e.g., the cladding material.

The effect of the present invention is further enhanced by applying the preheating step before the irradiation step. It is understood that the preheating step may be applied before the irradiation step for another interface. Preferably, the preheating step should be applied at a temperature of 200° to 1000° C. with the use of a suitable heating device such as those making use of light beams, YAG laser, $CO_2$ laser, high or low frequency and the like. This is because when the heating temperature is below 200° C., preheating does not produce useful effect, and when it exceeds 1000° C., there is possibility that oxidation, deformation, etc. of the heated surface may take place. In this case, the desired results are obtained, if preheating is applied to at least the substrate. When each of layers is irradiated with laser beams, said preheating treatment may be applied to many of the layer elements.

Preferably, a further rolling step (at 11a) may be applied at least one time after the roll cladding step (at 11) for fine adjustment of draft, etc. It is understood that the rolling step may be applied before or after the roll cladding step for another interface.

It is to be noted that the atmosphere used for the production of clad sheets may be a nonoxidizing atmosphere, e.g., an inert atmosphere such as Ar or $N_2$ or a reducing atmosphere such as $H_2$ to suppress undesired surface oxidation.

It is to be noted that the layer element materials to be used in the process aspects may be similar to those mentioned in connection with the product aspect of the present invention.

The present invention will now be explained in further detail with reference to the following nonrestrictive examples.

In the following the processes according to the present invention are disclosed with reference to FIGS. 6–10.

Figure 6:
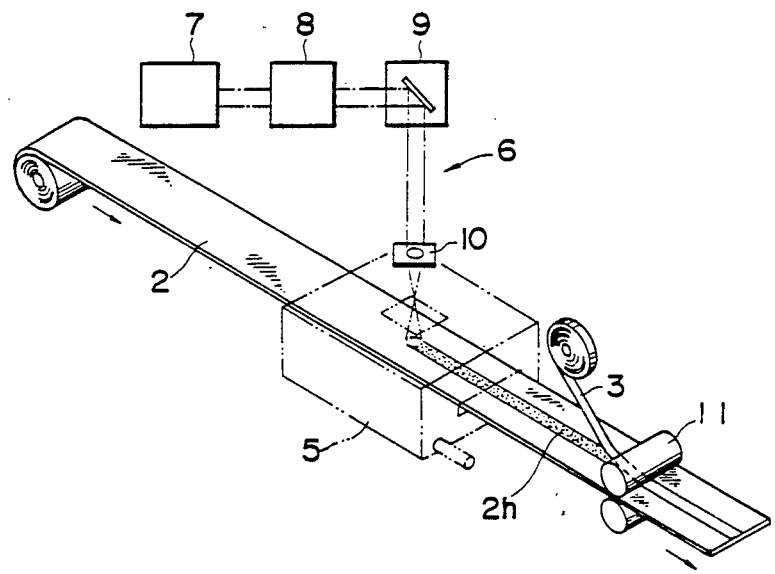
FIG. 6 is a perspective view showing one embodiment of the process according to the present invention.

FIG. 6 is a perspective view illustrating a production process of the present invention. Reference is now made to an example wherein one Al sheet in the striped form is cold-clad onto the middle portion, as viewed widthwise, of a 42% Ni-Fe alloy sheet (substrate).

A coil 2 of the 42% Ni-Fe alloy sheet is uncoiled, and is fed to an irradiation box 5 for irradiating the upper surface of the passing alloy sheet 2 with a laser beam, said box 5 being of the structure which surrounds the entire alloy sheet 2, and in which an Ar gas flows for laser beam irradiation. Above the box 5 there is irradiation unit 6 including components 7–10. Laser beam is generated from, e.g., a laser oscillator 7 for YAG laser, and are condensed and focused by an f$\theta$ lens 10 through a collimator 8 and a galvanic mirror 9. That lens 10 is then adjusted in such a manner that the required region of the middle portion, as viewed widthwise, of the alloy sheet 2 is exposed to the laser beam at a position spaced way from the focal point by the required distance.

If a polyhedral or segment mirror is employed in the irradiation unit used in this invention in place of the galvanic mirror 9, then it is possible to increase the scanning speed of laser. Alternatively, if a cylindrical lens is used to widely expose the alloy sheet to the laser beam, then it is possible to increase the rate of processing.

Laser beam is applied to the required width region at the middle portion, as viewed widthwise, of the alloy sheet 2 in a staggered or striped manner to melt and solidify the outermost surface layer thereof, thereby providing a surface portion free of deposites, fats and oils and water to produce a fresh surface. Then the sheet proceeds toward cladding rolls 11.

On the other hand an Al sheet 3 is uncoiled, and is then fed from above the sheet 2 to a nip of the cladding rolls 11 to bring it into contact with the laser beam-irradiated surface of the sheet 2.

In this case, the hardened layer portion formed on the irradiated surface is cracked on the surface by internal slip deformation to expose internal fresh faces, with which the Al sheet 3 comes into an intimate contact. For that reason, higher cleanness is obtained in comparison with the mechanically polished surface, and improvements are introduced into the bonding strength of the alloy sheet 2 and the Al sheet 3. In addition, a lower draft is obtained in comparison with the conventional process, so that soft products can be produced with high efficiency.

Figure 7:
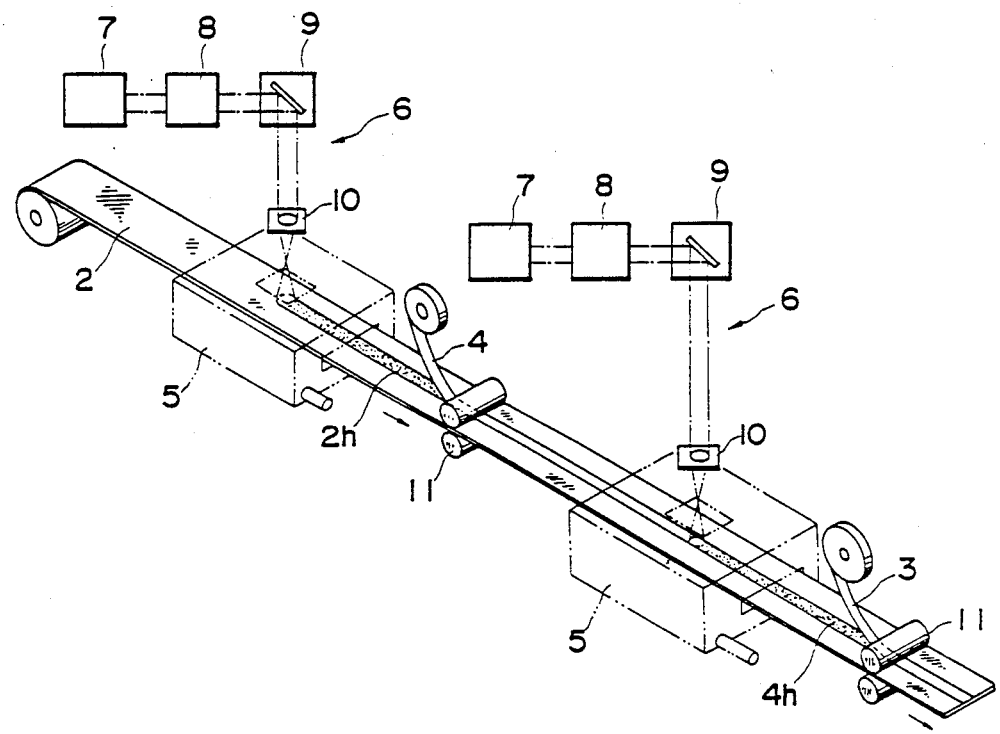

In the case of providing an intermediate layer 4, as shown in FIG. 7, two sets of irradiation unit 5 and cladding means 11 are disposed successively for the intermediate layer 4 and a cladding layer 3 in the advancing direction of a substrate 2.

Figure 8:
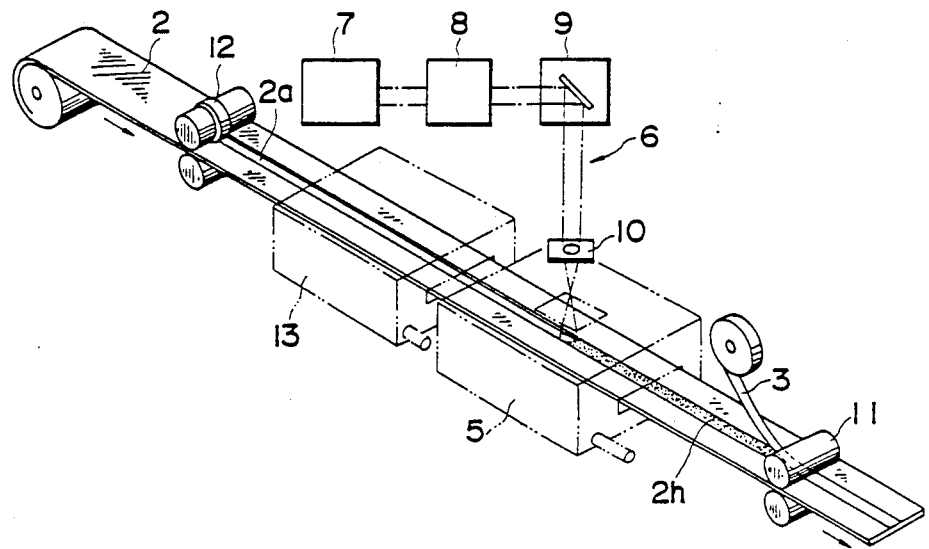
Figure 9:
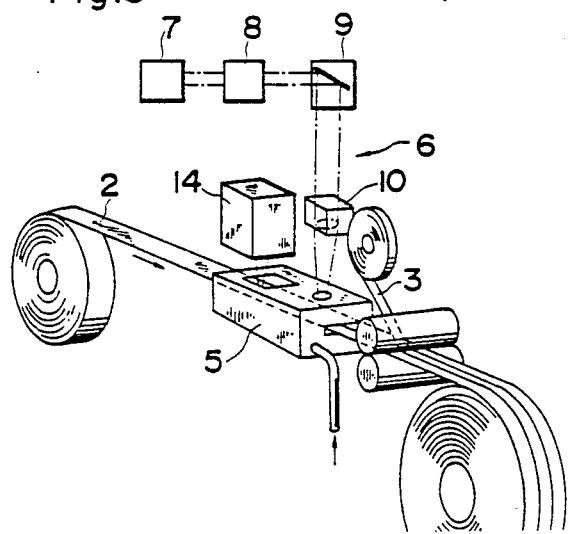
Figure 10A:
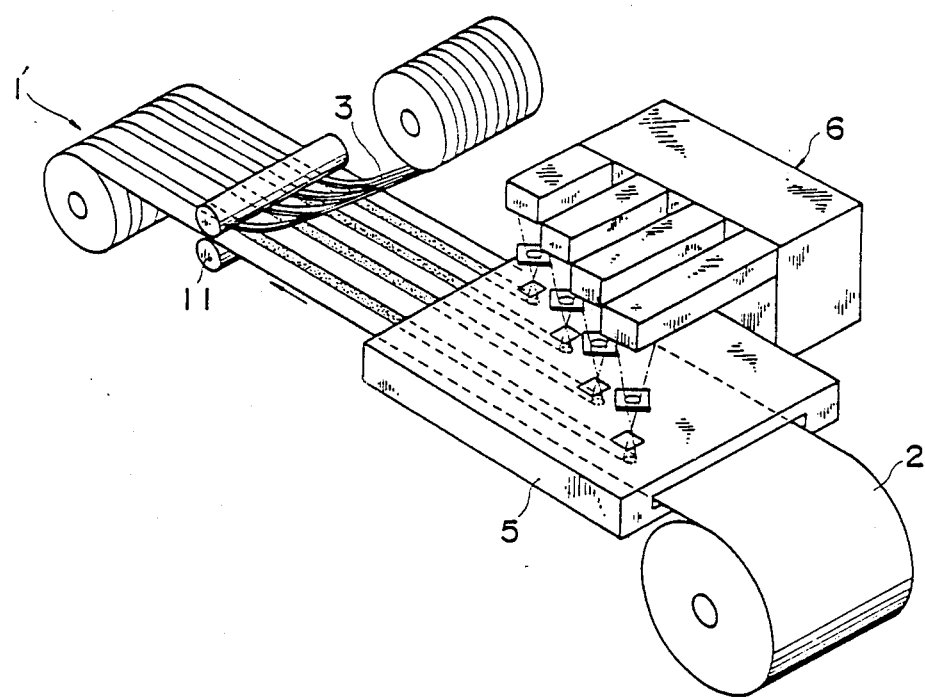
Figure 10B:
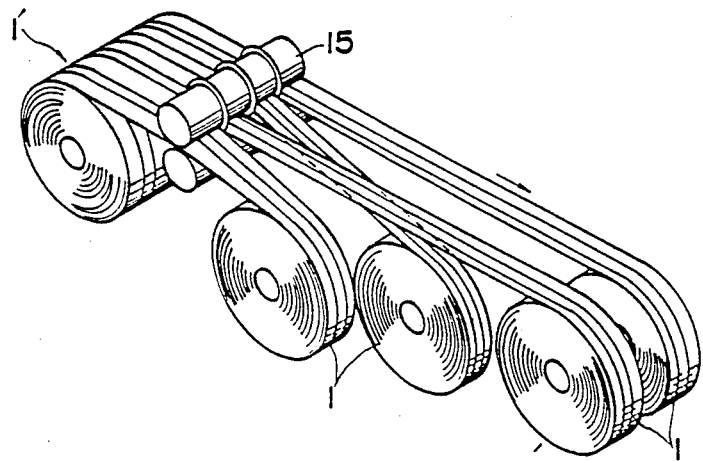

In the event that the groove-forming step is carried out prior to the irradiation step, as shown in FIG. 8, a coiled substrate 2 is uncoiled, is provided on the upper surface with a groove by means of a groove-forming roll 12 constituting groove-forming means, is annealed in an annealing furnace 13 in which a $H_2$ atmosphere prevails, and is finally fed to the irradiation step and then the cladding step.

Where the preheating step is carried out prior to the irradiation step, as shown in FIG. 9, a coiled substrate 2 is uncoiled, is passed through or below preheating means 14, and is thereafter fed to irradiation means and then cladding means.

Where a cladding layer 3 is laminated in the form of a multiplicity of stripes, as shown in FIG. 10A, irradiation means 6 and cladding means 11 are provided in correspondence to the number of stripes applied. In this case, the obtained multi-striped clad sheet 1' may be cut into mono-striped clad sheets 1 . . . by means of a slitter 15 (FIG. 10B).

Figure 11:
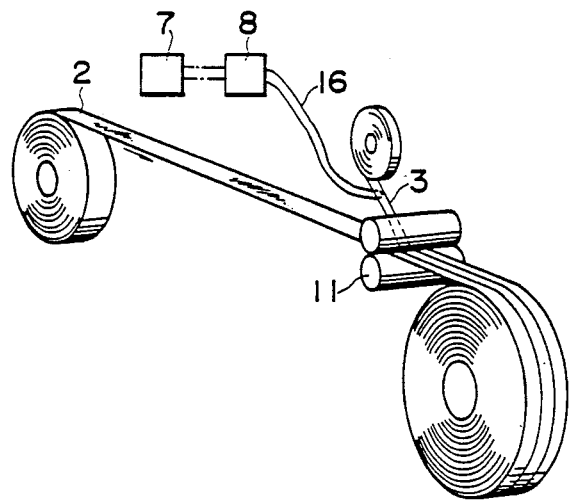
FIG. 11 shows a different beam irradiation means.

For irradiation, as illustrated in FIG. 11, beams generated by a laser osciallator 7 may be directly guided by way of an optical fiber, whereby the beams may easily be applied to varied positions (of alternatively not only the moving substrate 2 but also the cladding layer 3), or in varied forms.

The clad sheets of the present invention can preferably be applied to the lead frames for IC parts, in particular.

Figure 12:
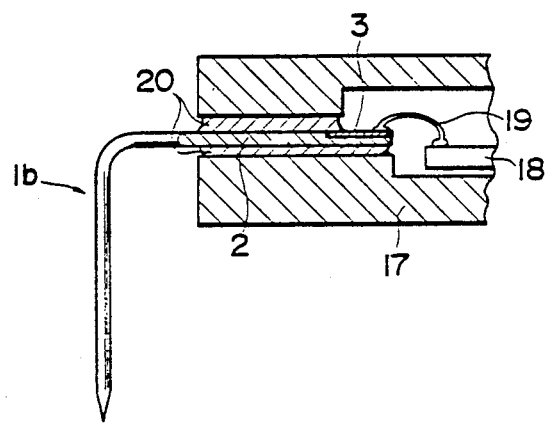
FIG. 12 is a partially-sectioned view illustrating an applied use of the clad sheets according to the present invention.

More concretely, as shown in FIG. 12, where a lead is applied to a Si chip 18 built in a ceramic IC package for external wiring, said lead is usually sealed in an IC package 17 with a low-melting glass 20. In accordance with the present invention, however, of the layer elements, the substrate 2 based on Fe-Ni is secured to the IC package 17 through the low-melting glass 20, while the cladding layer based on, e.g., Al is connected to a wire 19 (Al or Au) by ultrasonic or like means, said wire 19 being connected to the Si chip 18.

Further, where a metallized layer (for instance, ones formed by compaction of Ni powders, etc.) laminated on the IC package 17 is used in place of the wire 19 as the conductor means extending from the Si chip 18, the cladding layer 3, such as Ag solder, of the layer elements of the present invention is joined to said metallized layer extending to the side wall of the IC package 17. Where resins (e.g., epoxy resin) are used as IC package materials, it is preferred that, of the substrate materials according to the present invention, Cu alloys, Fe-Ni (containing 40–55% of Ni) and the like are used in view of compatibility.

Figure 13:
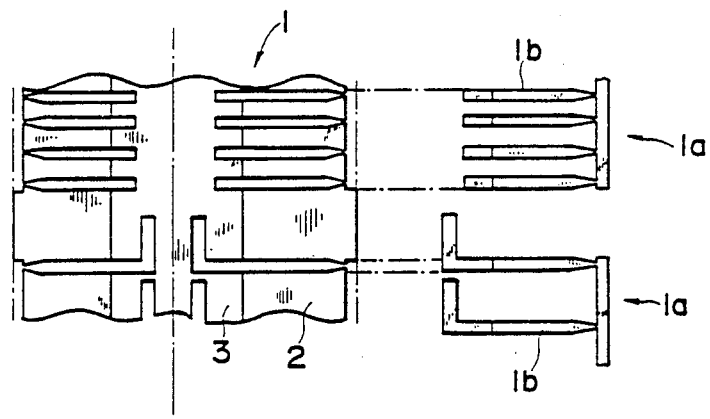
FIG. 13 is a plan view showing how to use the clad sheets according to the present invention.

It is understood that, as shown in FIG. 13, where the clad sheets of the present invention are used as the aforesaid leads, the previously prepared clad sheets may be cut into the form accommodated thereto. More concretely, the ribbon-like clad sheet 1 prepared is blanked or stamped into an loosely joined separable frame piece 1a containing lead portions 1b . . . , the substrate 2 and cladding layer 3 to form a lead frame, which is then joined to the IC package.

EXAMPLES

EXAMPLE 1-1

As a metal substrate use was made of a 42% Ni-Fe alloy sheet of 0.5 mm in thickness and 30 mm in width, and as a cladding layer an Al sheet of 0.08 mm in thickness and 10 mm in width and having a purity of 99.7%.

An argon gas prevailed in an irradiation box, and the moving speed of the substrate was 10 m/min.

As a laser irradiator device, a 10 kHzQ switch laser having a wavelength of 1 micrometer and an output of 100 W was used in a manner as shown in FIG. 6. With lenses having a focus spaced away from a substrate by 100 mm, the substrate was longitudinally continuosly irradiated on the middle portion, as viewed widthwise, with a laser beam at an irradiation width of 10 mm by a power density of 400 kW/mm² to form a uniformly irradiated surface. At a draft of 32.5%, the Al sheet was cold-clad onto the irradiated surface by means of cladding rolls.

Thereafter, cold rolling was applied once to obtain a striped clad sheet according to the present invention, which was 0.25 mm in thickness and 30 mm in width. The overall draft was 50%.

For the purpose of comparison, a striped clad sheet of the same size was prepared from the same metal substrate and cladding layer material by the following method. In the conventional manner, the substrate was mechanically polished on the surface with wire buffing method using a wire rotating brush of a 0.1 mm diameter wire and a moving rate of 22 m/sec, and the Al sheet was cold-clad thereonto by rolling.

Examinations were made of the size, appearance properties and mechanical properties of the thus obtained two clad sheets. The results are set forth in Table 1-1.

As clearly understood from Table 1-1, the present invention provides a softer clad sheet product which excels in appearance properties, and is of considerably improved quality.

TABLE 1-1

|  | Example 1 (present invention) | Comparison sample |
|---|---|---|
| Substrate | | |
| thickness (mm) | 0.5 | 0.5 |
| width (mm) | 30 | 30 |
| Cladding layer material | | |
| thickness (mm) | 0.08 | 0.08 |
| width (mm) | 10 | 10 |
| Clad sheet | | |
| thickness (mm) | 0.25 | 0.25 |
| width (mm) | 30 | 30 |
| Mechanical properties | | |
| tensile str. (kgf/mm²) | 73 | 76 |
| elongation (%) | 6 | 4 |
| hardness (Hv) | 220 | 230 |
| Appearance | no fine metal powder observed no blistering | fine metal powder occurred blistering |

TABLE 1-1-continued

|  | Example 1 (present invention) | Comparison sample |
|---|---|---|
|  | upon heating | upon heating |

Further examinations were made of the hardness of the substrate from its surface layer to its interior after laser beam irradiation (before cladding) according to the present invention and the hardness of the comparison substrate from its surface layer to its interior after wire buffing. The results are set forth in FIG. 14.

Figure 14:
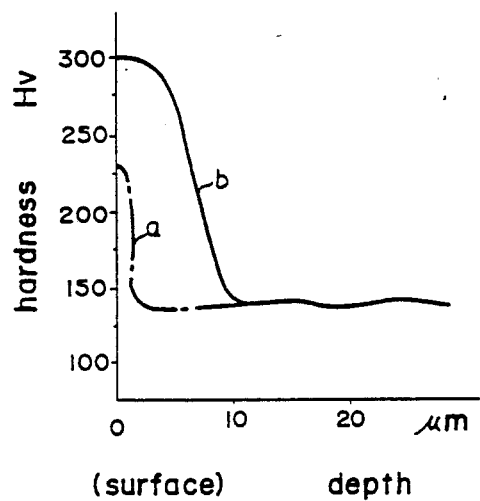
FIG. 14 is a graph showing the hardness (Hv) of an inventive substrate surface irradiated with laser beams (line a) and that of prior art (buffed surface, line b).

As evidently understood from FIG. 14, the surface layer of the substrate after wire buffing has been hardened across a thickness of about 10 micrometers. In contrast thereto the hardened layer portion of the inventive sample was at most 2 micrometer.

Since the hardened layer portion is generally inferior in deformation capability to the interior of the substrate, it undergoes rough cracking due to deformation taking place during roll-cladding, and the cladding material bonds closely to fresh faces only at the cracks. This is appreciated from the fact that for the comparison sample diffusion starts from such cracks, when heating is applied for bonding testing after cladding.

The aforesaid hardening per se brought about by wire buffing might be to some extent effective for the surface treatment to be applied before the cladding. However, where such treatment is effected until deposites, fats and oils and water are completely by removed to obtain the cleaned surface required for cladding, there is a fear that the polished surface may become markedly irregular due to abrasive machining through the wire buff to cause occurrence and deposition of scaly metal powders, which causes entrainment of a gas onto the surface to be clad. In addition, difficulty is involved in limiting such polishing to the striped portion of the substrate to be predetermined to be clad, when applying it. Besides there occur no uniform microcracks, which are obtainable in the present invention, by the buffing. Rather the buffing results in rough cracks or scaling which are not suitable for cladding purpose.

According to the present invention, on the contrary, it is possible to apply laser beam to the required striped portion, as illustrated in the instant example. Suitable selection of the irradiation conditions allows complete removal of deposites, fats and oils and water with no fear of the surface to be treated becoming irregular, and control of the thickness of the hardened layer formed by melting and rapid solidification can be done effectively in a controlled manner, i.e., by a very thin layer thickness.

The hardened layer according to the present invention is found to be hardened through melting and rapid solidification, and undergoes microcracking on the surface under the influence of internal slip deformation during roll-cladding. Fresh faces occurring in the resulting microcracks provide a larger area for cladding at a reduced draft than do those of the comparison example, are uniformly distributed, and bonded closely to the cladding material. This has been ascertained from the fact that diffusion proceeds uniformly, when heating is applied for integrity testing after cladding.

EXAMPLE 1-2

For the metal substrate and the cladding material, use was made of a 42% Ni-Fe alloy sheet of 0.35 mm and 25 mm in width and an Al sheet of 0.08 mm in thickness and 5.5 mm in width.

An argon gas prevailed in an irradiator box, and the moving speed of the substrate was 80 mm/sec. With a draft at cladding of 24% and a total draft of 29% an inventive sample and a comparison sample were prepared otherwise like the forgoing (1.1).

The results are shown in Table 1-2.

TABLE 1-2

|  | Example 1 (present invention) | Comparison sample |
|---|---|---|
| Substrate |  |  |
| thickness (mm) | 0.35 | 0.5 |
| width (mm) | 25 | 25 |
| Cladding layer material |  |  |
| thickness (mm) | 0.02 | 0.02 |
| width (mm) | 10 | 10 |
| Clad sheet |  |  |
| thickness (mm) | 0.25 | 0.25 |
| width (mm) | 25 | 25 |
| Mechanical properties |  |  |
| tensile str. (kgf/mm$^2$) | 78 | 78 |
| elongation (%) | 8 | 3.5 |
| hardness (Hv) | 205 | 230 |
| Appearance | no fine metal powder observed no blistering upon heating | fine metal powder occurred blistering upon heating |

EXAMPLE 1-3

For the metal substrate and the cladding material, use was made of a 42% Ni-Fe alloy sheet of 0.35 mm and 32.9 mm in width and an Al sheet 0.01 mm in thickness and 10 mm in width.

An argon gas prevailed in an irradiator box, and the moving speed of the substrate was 10 m/min. With a stripe width of 10 mm, a draft at cladding of 32.5% and a total draft of 37.5% and inventive sample and a comparison sample were prepared otherwise like the forgoing (1-1). The results were similar to Example 1-2.

EXAMPLE 2

For the metal substrate and the cladding material, use was made of a 42% Ni-Fe alloy sheet of 0.36 mm and 23 mm in width and an Al sheet of 0.08 mm in thickness and 5.5 mm in width and having a purity of 99.7%.

An argon gas prevailed in an irradiator box, and the moving speed of the substrate was 10 m/min.

The laser irradiator device used was a 10 kHzQ switch laser having an output of 100 W.

In accordance with the process of this invention as mentioned before and illustrated in FIG. 6, the substrate was longitudinally continuously irradiated on the middle portion of 5.5 mm in width, as viewed widthwise, with a laser beam at an irradiation width of 5.5 mm and a pitch width of 0.5 mm under such conditions that a distance from the focus of lenses was 100 mm, a wavelength was 1.0 micrometer and a laser power density was 500 kW/mm$^2$ to form a staggeringly irradiated surface which extends as a whole constitute a wide stripe 2S, as shown in FIG. 4, comprising an irradiated portion 2i and an unirradiated, thermally affected portions 2b. The Al sheet was cold-clad by rolling onto said irradiated surface at a draft of 29%.

Thereafter, cold rolling was applied once to obtain a striped clad sheet according the present invention, which was 0.25 mm in thickness and 23 mm in width. The overall draft was 30%.

For the purpose of comparison, a striped clad sheet of the same size was prepared from the same metal substrate and cladding material by the following method. In the conventional manner, the substrate was mechanically polished on the surface with the wire buffing technique using a wire rotating brush of 0.1 mm (diameter) and a moving rate of 22 m/sec, and the Al sheet was cold-clad thereonto by rolling.

Examinations were made of the size, appearance properties and mechanical properties of the thus obtained two clad sheets. The results are set forth in Table 2.

TABLE 2

|  | Example 2 (present invention) | Comparison sample |
|---|---|---|
| Substrate |  |  |
| thickness (mm) | 0.36 | 0.5 |
| width (mm) | 23 | 23 |
| Cladding layer material |  |  |
| thickness (mm) | 0.08 | 0.08 |
| width (mm) | 5.5 | 5.5 |
| Clad sheet |  |  |
| thickness (mm) | 0.25 | 0.25 |
| width (mm) | 23 | 23 |
| Mechanical properties |  |  |
| tensile str. (kgf/mm$^2$) | 72 | 78 |
| elongation (%) | 8 | 3.5 |
| hardness (Hv) | 210 | 230 |
| Appearance | no fine metal powder observed no blistering upon heating | fine metal powder occurred blistering upon heating |

EXAMPLE 3

For the metal substrate and the intermediate layer material, use was made of a 42% Ni-Fe alloy sheet of 1.00 mm in thickness and 25 mm in width and a Ni sheet of 0.08 mm in thickness and 5.5 mm in width and having a purity of 99.7, respectively.

For the cladding material, use was made of a Ag sheet of 0.08 mm in thickness and 5.5 mm in width and having a purity of 99.9%.

An argon gas prevailed in an irradiator box, and the moving rate of the substrate was 80 cm/sec.

The laser irradiator device used was a 10 kH$_2$Q switch laser having an output of 50 W.

In accordance with the process illustrated in FIG. 7, the substrate was longitudinally continuously irradiated on the middle portion of 5.5 mm in width, as viewed widthwise, with laser beams at an irradiation width of 5.5 mm and a pitch width of 0.5 mm under such conditions that a distance from the focus of lenses was 100 mm, a wavelength was 1.06 micrometers, and a laser power density was 500 kW/mm$^2$, thereby forming a staggeringly irradiated surface area which, as shown in FIG. 4, comprised irradiated portions 2i and unirradiated thermally affected portions 2b. The Ni sheet serving as the intermediate layer material was cold-clad onto said irradiated surface area by rolling at a draft of 17%.

The Ni intermediate layer clad onto the substrate was further irradiated on the surface with laser beams under the same irradiation conditions as mentioned above to form a staggeringly irradiated surface area, on which the Ag sheet was cold clad at a draft of 70%.

Thereafter, cold rolling was applied once to obtain a striped clad sheet according to the present invention, which was 0.25 mm in thickness and 25 mm in width. The overall rolling rate was 75%.

For the purpose of comparison, a striped clad sheet of the same size was prepared from the same metal substrate, intermediate layer material and cladding material by the following method. In the conventional manner, the substrate was mechanically polished on the surface with the wire buffing method using a wire rotating brush of 0.1 mm diameter and a moving rate of 22 m/sec., and the Ni sheet serving as the intermediate layer material was then cold-clad by rolling onto the thus treated substrate. Furthermore, the Ag sheet was cold-clad by rolling onto the surface of the intermediate layer material which had been polished by wire buffing under the same conditions.

Examinations were made of the size appearance properties and mechanical properties of the thus obtained two clad sheets. The results are set forth in Table 3.

TABLE 3

|  | Example 3 (present invention) | Comparison sample |
| --- | --- | --- |
| Substrate |  |  |
| thickness (mm) | 1.0 | 1.0 |
| width (mm) | 25 | 25 |
| Intermediate layer |  |  |
| thickness (mm) | 0.08 | 0.08 |
| width (mm) | 5.5 | 5.5 |
| Cladding layer material |  |  |
| thickness (mm) | 0.08 | 0.08 |
| width (mm) | 5.5 | 5.5 |
| Clad sheet |  |  |
| thickness (mm) | 0.25 | 0.25 |
| width (mm) | 25 | 25 |
| Mechanical properties |  |  |
| tensile str. (kgf/mm$^2$) | 78 | 78 |
| elongation (%) | 3.5 | 3.0 |
| hardness (Hv) | 230 | 235 |
| Appearance | no fine metal powder observed no blistering upon heating | fine metal powder occurred blistering upon heating |

EXAMPLE 4-1

For the metal substrate and the cladding material, use was made of a 42% Ni-Fe alloy sheet of 1 mm in thickness and 25 mm in width, and a 85% Ag-Cu solder sheet of 0.03 mm in thickness and 3.0 mm in width, respectively.

A groove of 0.3 mm in depth and 3.0 mm in width was formed on the middle portion of one primary surface of the metal substrate by means of cold rolling. The metal substrate sheet was then annealed at 1000° C. for 30 second in hydrogen.

Thereafter, laser beams were applied to the concave groove formed on the one primary surface of the substrate under the following irradiation conditions.

An argon gas prevailed in an irradiator box, and the moving speed of the substrate was 10 m/min.

The laser irradiator device used was a 10 kHzQ switch laser having a wavelength of 1 micrometer and an output of 100 W, and the lenses had their focus spaced away from the surface by 100 mm. In accordance with the process of this invention as mentioned above and illustrated in FIG. 8, the groove in the substrate was longitudinally continuously irradiated on the bottom of 3.0 mm in width with a laser beam at an irradiation width of 3 mm and a pitch width of 0.5 mm under such a condition that a power density was 500 kW/mm$^2$, thereby forming a staggeringly irradiated surface area which, as shown in FIG. 4, forms a generally longitudinally extending wide stripe 2S comprising irradiated portion 2i and unirradiated, thermally affected portions 2b. The aforesaid Ag-Cu base solder sheet was cold-clad by rolling onto said irradiated surface area by means of cladding rolls at a draft of 60%.

Thereafter, cold rolling was applied once to obtain a striped clad sheet according to the instant example, which was 0.25 mm in thickness and 25 mm in width. The overall draft was 75%.

For the purpose of comparison, a striped clad sheet of the same size was prepared from the same metal substrate and cladding material by the following method. In the conventional manner, the substrate was mechanically polished on the surface with the wire buffing method using a wire rotating brush of 0.1 mm diameter and a moving rate of 22 mm/sec, and the Ag-Cu base solder sheet was cold-clad by rolling thereonto.

Examinations were made of the size, appearance properties and mechanical properties of the thus obtained two clad sheets. The results are set forth in Table 4.

TABLE 4

|  | Example 4 (present invention) | Comparison sample |
| --- | --- | --- |
| Substrate |  |  |
| thickness (mm) | 1 | 1 |
| width (mm) | 25 | 25 |
| Cladding layer material |  |  |
| thickness (mm) | 0.3 | 0.3 |
| width (mm) | 3 | 3 |
| Clad sheet |  |  |
| thickness (mm) | 0.25 | 0.25 |
| width (mm) | 25 | 25 |
| Mechanical properties |  |  |
| tensile str. (kgf/mm$^2$) | 78 | 80 |
| elongation (%) | 3 | 2 |
| hardness (Hv) | 240 | 245 |
| Appearance | no fine metal powder observed no blistering upon heating | fine metal powder occurred blistering upon heating |

EXAMPLE 4-2

A 42% Ni-Fe alloy sheet of 0.5 mm in thickness and 23 mm in width was used for the metal substrate, and was provided on the middle portion of one primary side thereof with one groove of 5.5 mm in width and 0.1 mm in depth. After 30-second annealing at 1000° C., the position, corresponding to the groove, of the surface of the substrate in opposition to the surface provided with the groove was preheated to 400° C. with light beams in a N$_2$ gas atmosphere.

With a Q switch pulse laser having a wavelength of 1 micrometer and an output of 100 W and under the same laser beam irradiation conditions as in Example 4-1, the substrate was staggeringly irradiated with laser beam, as shown in FIG. 4, thereby forming irradiated portions 2*i* and unirradiated portions 2*b*, and was then cold-clad by rolling thereonto with an Al sheet serving as the cladding material. Thereafter, cold rolling was applied once to obtain a striped clad sheet according to this invention, which was 0.25 mm in thickness and 23 mm in width. The overall draft was 50%. The result was successful like Table 4.

EXAMPLE 5-1

For the metal substrate and the cladding material, use was made of a 42% Ni-Fe alloy sheet of 0.35 mm in thickness and 25 mm in width and an Al sheet of 0.02 mm in thickness and 5.5 mm in width, respectively.

An argon gas prevailed in an irradiator box, and the moving speed of the substrate was 80 cm/sec.

A 5.5 mm-wide region of the middle portion, as viewed widthwise, of the substrate was preheated to 400° C. with light beams.

The laser irradiator device used was a 10 kHzQ switch laser having an output of 50 W, a wavelength of 1 micrometer, and the lenses had their focus spaced away from the surface by 100 mm. In accordance with the process of this invention as mentioned above and illustrated in FIG. 9, the substrate was longitudinally continuously irradiated on the middle portion of 5.5 mm in width, as viewed widthwise, with a laser beam to form a uniformly irradiated surface. The Al sheet was cold-clad by rolling onto said irradiated surface at a draft of 24%.

Thereafter, cold rolling was applied once to obtain a striped clad sheet according to the present invention, which was 0.25 mm in thickness and 25 mm in width. The overall draft was 29%.

For the purpose of comparison, a striped clad sheet of the same size was prepared from the same metal substrate and cladding material by the following method. In the conventional manner, the substrate was mechanically polished on the surface with the wire buffing method using a wire rotating brush of 0.3 mm diameter and a moving speed of 17 m/sec, and the Al sheet was then cold-clad thereonto.

Examinations were made of the size, appearance properties and mechanical properties of the thus obtained two clad sheets. The results are set forth in Table 5.

TABLE 5

|  | Example 5 (present invention) | Comparison sample |
|---|---|---|
| Substrate |  |  |
| thickness (mm) | 0.35 | 0.5 |
| width (mm) | 25 | 25 |
| Cladding layer material |  |  |
| thickness (mm) | 0.02 | 0.02 |
| width (mm) | 10 | 10 |
| Clad sheet |  |  |
| thickness (mm) | 0.25 | 0.25 |
| width (mm) | 25 | 25 |
| Mechanical properties |  |  |
| tensile str. (kgf/mm$^2$) | 68 | 74 |
| elongation (%) | 9 | 4 |
| hardness (Hv) | 203 | 228 |
| Appearance | no fine metal powder observed no blistering | fine metal powder occurred blistering |

TABLE 5-continued

|  | Example 5 (present invention) | Comparison sample |
|---|---|---|
|  | upon heating | upon heating |

EXAMPLE 5-2

A substrate sheet of a 33 mm width was used, and a staggered irradiation was applied as shown in FIG. 4 otherwise in the same manner as in Example 5-1, resulting in a clad sheet with a 0.25 mm thickness and a 33 mm width. The total draft was 29%. The results were successful like

EXAMPLE 5-1.

EXAMPLE 6

A 42% Ni-Fe alloy sheet of 0.45 mm in thickness and 130 mm in width was used for the metal substrate 2 which, as shown in FIG. 10, was then formed on its one primary surface with four stripes of irradiated surfaces using a leaser beam irradiator device 11 oscillating a Q switch pulse laser having a wavelength of 1 micrometer and an output of 100 W and capable of forming four stripes of irradiated surfaces of 5.5 mm in width at an interval of 25 mm and under the same laser beam irradiation conditions as mentioned in Example 1. Subsequently, the aforesaid Al sheets serving as the cladding materials were simultaneously cold-clad by rolling onto the four irradiated surfaces by means of cladding rolls 11. Thereafter, cold rolling was applied three times to obtain a multi-striped clad sheet 1' according to the present example, which was 0.25 mm in thickness and 130 mm in width.

With a slitter 15, thereafter, the sheet 1' was cut into a monostriped sheet 1 . . . according to the present invention, which was 0.25 mm thickness and 25 mm in width. The overall draft was 44%.

For the purpose of comparison, a striped clad sheet of the same size was prepared from the same metal substrate and cladding material by the following method. In the conventional manner, the substrate was mechanically polished on the surface with the wire buffing method using a wire rotating brush of 0.1 mm diameter and a moving rate of 22 m/sec, and the Al sheet was cold-clad by rolling thereonto.

Examinations were made of the size, appearance properties and mechanical properties of the thus obtained two clad sheets. The results are set forth in Table 6.

TABLE 6

|  | Example 6 (present invention) | Comparison sample |
|---|---|---|
| Substrate |  |  |
| thickness (mm) | 0.45 | 0.45 |
| width (mm) | 130 | 130 |
| Cladding layer material |  |  |
| thickness (mm) | 0.08 | 0.08 |
| width (mm) | 5.5 | 5.5 |
| Clad sheet |  |  |
| thickness (mm) | 0.25 | 0.25 |
| width (mm) | 25 | 25 |
| Mechanical properties |  |  |
| tensile str. (kgf/mm$^2$) | 72 | 73 |
| elongation (%) | 7 | 6 |

TABLE 6-continued

|  | Example 6 (present invention) | Comparison sample |
|---|---|---|
| hardness (Hv) | 218 | 220 |
| Appearance | no fine metal powder observed no blistering upon heating | fine metal powder occurred blistering upon heating |

As clearly understood from Table 6, the present invention provides a softer clad sheet product which excels in appearance properties, and is of considerably improved quality.

What is claimed is:

1. A process for producing clad sheets for IC lead frames, which comprises:
   forming a hardened layer portion having a thickness of 5 micrometers or less by melting and rapid solidification through irradiating at least one surface of a metal substrate with at least one laser beam, and cold-cladding a metal cladding layer material by rolling onto the beam-irradiated surface of said substrate, said metal cladding layer material penetrating into microcracks of the hardened layer portion which are produced during the cold-cladding.

2. A process for producing clad sheets for IC lead frames, which comprises the steps:
   (a) forming a hardened layer portion having a thickness of 5 micrometers or less by melting and rapid solidification through irradiating at least one surface of a metal substrate with at least one laser beam,
   (b) cold-cladding a metal intermediate layer material onto the beam-irradiated surface of said substrate, said metal intermediate layer material penetrating into microcracks of the hardened layer portion which are formed during the cold-cladding,
   (c) forming a hardened layer portion having a thickness of 5 micrometers or less by melting and rapid solidification through irradiating a free surface of said intermediate layer opposite to said substrate with at least one laser beam, and
   (d) cold-cladding a cladding layer material onto the beam-irradiated surface of said intermediate layer, said cladding layer material penetrating into microcracks which are formed in the hardened layer portion on the intermediate layer during the cold-cladding.

3. A process for producing clad sheets for IC lead frames, which comprises the steps:
   (a) forming a hardened layer portion having a thickness of 5 micrometers or less by melting and rapid solidification through irradiating one surface of a metal substrate with at least one laser beam,
   (b) cold-cladding a metal intermediate layer material onto the beam-irradiated surface of said substrate, said metal intermediate layer material penetrating into microcracks of the hardened layer portion which are formed during the cold-cladding,
   (c) forming a hardened layer portion having a thickness of 5 micrometers or less by melting and rapid solidification through irradiating a free surface of said intermediate layer opposite to said substrate with at least one laser beam, and
   (d) cold-cladding a cladding layer material onto the beam-irradiated surface of said intermediate layer, said cladding layer material penetrating into microcracks which are formed in the hardened layer portion on the intermediate layer during the cold-cladding,
   (e) forming a hardened layer portion having a thickness of 5 micrometers or less by melting and rapid solidification through irradiating the other surface of said metal substrate with at least one laser beam, and
   (f) cold-cladding a metal cladding layer material onto the beam-irradiated surface of said substrate, this metal cladding layer material penetrating into microcracks which are formed in the hardened layer portion on said the other surface during cold cladding.

4. A process for producing clad sheets, which comprises irradiating at least one surface of a metal substrate with at least one laser beam, cold-cladding a metal cladding layer material by rolling onto the beam irradiating surface of said substrate, and further comprising providing a substrate previously formed with a groove on a surface of said substrate, and applying at least one laser beam to a surface of said substrate opposite to said predetermined surface at a position corresponding to said groove.

5. A process for producing clad sheets, which comprises irradiating at least one surface of a metal substrate with at least one laser beam, cold-cladding a metal cladding material by rolling onto the beam-irradiated surface of said substrate; and further comprising,
   preheating said surface assigned to laser beam irradiation before said irradiation.

6. A process as defined in any one of claims 1, 2 or 3, wherein said metal substrate is at least one of a Ni-Fe alloy, Ni-Co-Fe alloy, and Cu alloy.

7. A process as defined in claim 6, wherein said metal substrate is formed of at least one of, by weight %, 40 to 55% Ni-bal Fe alloys, 25 to 50% Ni-10 to 20% Co-bal Fe alloys and Cu alloys containing at least 55% Cu.

8. A process as defined in any one of claims 1 to 3, wherein said cladding layer is formed of at least one of Al, Al alloy, Ag, Ag solder, Pb-Sn solder, Au and brass solder.

9. A process as defined in claim 8, wherein the cladding layer is Al.

10. A process as defined in claim 2 or 3, wherein said intermediate layer is formed of at least one of Ni, Cu and Cu alloys.

11. A process as defined in claim 2 or 3, wherein the substrate is an Ni-Fe alloy, Ni-Co-Fe alloy or Cu alloy, the cladding layer is Ag or solder, and the intermediate layer is Cu, Cu alloys or Ni.

12. A process as defined in claim 11, wherein the substrate is a 40 to 55 wt % Ni-Fe alloy, the cladding layer is Ag, and the intermediate layer is Ni.

13. A process for producing clad sheets as defined in any one of claims 1 to 3, wherein the irradiation of the laser beam is conducted at a wavelength not exceeding 5 micrometers and a beam energy density of 100 to 1500 kW/mm².

14. A process for producing clad sheets as defined in claim 13, wherein the irradiation is conducted at a wavelength not exceeding 2 micrometer and a beam energy density of 300 to 900 kW/mm².

15. A process for producing clad sheets as defined in any one of claims 1 to 3, wherein cold cladding is conducted at a draft of 25 to 70%.

16. A process for producing clad sheets as defined in any one of claims 1 to 3, which further includes:
providing a substrate previously formed with a groove on the surface assigned to be clad, and irradiating said groove with at least one laser beam.

17. A process for producing clad sheets as defined in claim 16, which further includes annealing said substrate prior to the irradiation.

18. A process for producing clad sheets as defined in claim 4, which further includes annealing said substrate prior to the irradiation.

19. A process for producing clad sheets as defined in claim 1, wherein said preheating is carried out at 200° to 1000° C. in a nonoxidizing atmosphere.

20. A process for producing clad sheets as defined in claim 19, wherein said preheating is carried out by a light-beam, YAG-laser, $CO_2$-laser, high frequency or low-frequency heating device.

21. A process for producing clad sheets as defined in any one of claims 1 to 3, which further includes carrying out cold rolling after cold cladding.

22. A process for producing clad sheets as defined in any one of claims 1 to 3, wherein the irradiation is effected to an area covering at least 70% of an area to be clad.

23. A process for producing clad sheets as defined in claim 22, wherein the irradiation is effected in such a manner that at least the area to be clad is thermally affected by the irradiation.

24. A process for producing clad sheets as defined in claim 23, wherein the laser beam is generated by a YAG oscillator.

25. A process for producing clad sheets as defined in any one of claims 1 to 3, wherein the laser irradiation is conducted on the metal substrate under movement thereof.

26. A process for producing clad sheets as defined in claim 25, wherein the laser beam is applied in the form of at least one stripe along the moving direction of said substrate.

27. A process for producing clad sheets as defined in claim 25, wherein the laser beam is applied by scanning.

28. A process for producing clad sheets as defined in claim 27, wherein the scanning is effected in a staggered, meandered or striped manner.

29. A process for producing clad sheets as defined in any one of claims 1 to 3, wherein the laser beam is condensed and focused by a lens system and is applied to the surface to be irradiated at a focus or a position spaced away therefrom by a certain distance.

30. A process for producing clad sheets as defined in claim 29, wherein said lens system includes a scanning mirror.

31. A process for producing clad sheets as defined in any one of claims 1 to 3, wherein the laser beam is guided to a given position for irradiation through optic fibers.

32. A process for producing clad sheets as defined in claim 2, wherein said steps (a) to (d) are carried out in that order.

33. A process for producing clad sheets as defined in claim 2, wherein said steps (b) and (d) are simultaneously carried out.

34. A process for producing clad sheets as defined in claim 3, wherein said steps (a) to (d) are carried out in that order.

35. A process for producing clad sheets as defined in claim 3, wherein said steps (a) to (d) and (e) to (f) are separately carried out.

36. A process for producing clad sheets as defined in claim 3, wherein a pair of said steps (b) and (f), or (d) and (f) is simultaneously carried out.

* * * * *